United States Patent [19]

Ninomiya et al.

[11] Patent Number: 5,532,959
[45] Date of Patent: Jul. 2, 1996

[54] ELECTRICALLY ERASABLE AND PROGRAMMABLE READ ONLY MEMORY DEVICE EQUIPPED WITH INSPECTION CIRCUIT FOR THRESHOLD LEVELS OF MEMORY CELLS

[75] Inventors: Kazuhisa Ninomiya; Toshiya Sato, both of Tokyo, Japan

[73] Assignee: NEC Corporation, Tokyo, Japan

[21] Appl. No.: 427,833

[22] Filed: Apr. 26, 1995

Related U.S. Application Data

[63] Continuation of Ser. No. 266,115, Jun. 27, 1994, abandoned, which is a continuation of Ser. No. 950,013, Sep. 24, 1992, abandoned.

[30] Foreign Application Priority Data

Sep. 27, 1991 [JP] Japan .................................. 3-277190

[51] Int. Cl.⁶ .................................................. G11C 16/04
[52] U.S. Cl. ................... 365/185.3; 365/185.24; 365/236; 365/189.09
[58] Field of Search .................................... 365/185, 201, 365/218, 185.3, 185.24, 236, 189.09; 371/21.4

[56] References Cited

U.S. PATENT DOCUMENTS

| | | | |
|---|---|---|---|
| 5,053,990 | 10/1991 | Kreifels et al. | 365/218 |
| 5,097,444 | 3/1992 | Fong | 365/185 |
| 5,122,985 | 6/1992 | Santin | 365/185 |
| 5,132,935 | 7/1992 | Ashmore, Jr. | 365/185 |
| 5,214,605 | 5/1993 | Lim et al. | 365/218 |
| 5,220,533 | 6/1993 | Turner | 365/218 |
| 5,237,535 | 8/1993 | Mielke et al. | 365/218 |
| 5,241,507 | 8/1993 | Fong | 365/218 |

FOREIGN PATENT DOCUMENTS 3-225700  10/1991  Japan .................................. 365/218

*Primary Examiner*—David C. Nelms
*Assistant Examiner*—Andrew Q. Tran
*Attorney, Agent, or Firm*—Sughrue, Mion, Zinn, Macpeak & Seas

[57] ABSTRACT

An electrically erasable and programmable read only memory device enters an automatic erasing mode of operation, and repeats short erasing operation followed by confirmation of proper erased state in the automatic erasing mode, wherein the memory cell array is inspected to see whether or not each memory cell not only enters the erased state but also remains in enhancement mode so that the memory cell array is exactly programmed in a programming mode of operation.

8 Claims, 10 Drawing Sheets

5,532,959

ELECTRICALLY ERASABLE AND PROGRAMMABLE READ ONLY MEMORY DEVICE EQUIPPED WITH INSPECTION CIRCUIT FOR THRESHOLD LEVELS OF MEMORY CELLS

This is a Continuation of application Ser. No. 08/266,115 filed Jun. 27, 1994 now abandoned which is a Continuation Application of application Ser. No. 07/950,013 filed Sep. 24, 1992 now abandoned.

FIELD OF THE INVENTION

This invention relates to an electrically erasable and programmable read only memory device and, more particularly, to an inspection circuit of the electrically erasable and programmable read only memory device for checking the memory cells to see whether or not the threshold levels have been regulated into a proper range.

DESCRIPTION OF THE RELATED ART

An electrically erasable and programmable read only memory device has a memory cell array which is implemented by floating gate type field effect transistors. The floating gate type field effect transistors respectively serve as addressable memory cells, and are arranged in rows and columns. Word lines are respectively associated with the rows of the memory cells, and each word line is shared between the control gate electrodes of the associated row of the floating gate type field effect transistors. Digit lines are respectively associated with the columns of the memory cells, and each digit line is coupled with the drain nodes of the associated column of the floating gate type field effect transistors. The word lines and the digit lines are respectively assigned row addresses and column addresses, and every memory cell is addressable through a word line and a digit line selected by an external address signal.

The threshold level of each floating gate type field effect transistor is regulable between high and low voltage levels, and the high and low threshold levels are corresponding to the two logic levels of a data bit stored therein. Namely, when hot electrons are injected into the floating gate electrode of a floating gate type field effect transistor, the threshold voltage level thereof is elevated to the high level, and the floating gate type field effect transistor enters injected state indicative of logic "0" level. However, if the electrons are evacuated from the floating gate electrode to the source node thereof across the thin gate oxide film as Fowler-Nordheim tunneling current, the threshold voltage level is decayed to the low level, and the floating gate type field effect transistor enters erased state indicative of logic "1" level. When a memory cell is selected, the control gate electrode of the floating gate type field effect transistor is lifted to an intermediate voltage level between the high threshold level and the low threshold level, and the drain node is coupled with a sense circuit. In this situation, current is supplied through the associated digit line to the drain node to see whether or not the floating gate type field effect transistor turns on, and the sense circuit checks the voltage level on the digit line so as to discriminate the logic level of the data bit. Thus, the electrically erasable and programmable read only memory device selectively enters the erasing mode for evacuating electrons, the programming mode for injecting hot electrons and the read-out mode of operation for discriminating the threshold level.

One of the problems inherent in the electrically erasable and programmable read only memory device is an excessively erased state. In detail, the electrons are evacuated from the floating gate electrodes to the source nodes across the thin gate oxide films in the erasing mode of operation as described above. However, if electrons are excessively evacuated from the floating gate electrode of a floating gate type field effect transistor, the floating gate type field effect transistor undesirably enters depletion mode, and conductive channel takes place under application of an inactive voltage level such as the ground voltage level to the control gate electrode. If a selected memory cell is implemented by the depletion mode field effect transistor, the voltage level on the associated digit line is always indicative of the erased state regardless of the state of a selected memory cell, and the sense circuit determines the accessed data bit to be logic "1" level at all times. Thus, the floating gate type field effect transistors should be prevented from entering the excessively erased state.

One of the approaches effective against the excessively erased state is repetition of a short erasing operation followed by an inspection of threshold level. Two erasing sequences have been already disclosed. One of the erasing sequences is disclosed in "A 90-ns One-Million Erase/Program Cycle for 1M-Bit Flash Memory", IEEE Journal of Solid-State Circuits, vol. 24, No. 5, October 1989, pages 1259 to 1264. The other erasing sequence is disclosed in "A Novel Automatic Erase Technique Using Internal Voltage Generator for IM-Bit Flash EEPROM", Sympo VLSI Circuit Dig. Tech. Papers, pages 99 and 100. The former is carried out under an external control, and the latter is internally controlled. FIGS. 1 and 2 respectively illustrate the former and latter erasing sequences, and description will be made of these two erasing sequences.

Referring first to FIG. 1, the first erasing sequence starts with a programming operation on the memory cell array as by step S1. Namely, a data byte of "$00_H$" is written into all of the memory cell blocks forming the memory cell array. Then, hot electrons are injected into the floating gate electrodes of all the floating gate type field effect transistors, and the threshold levels thereof are elevated to the high voltage level. Upon completion of the injection, all of the floating gate type field effect transistors enter the injected state, and the memory cell blocks respectively store data bytes of "$00_H$".

Subsequently, an erasing command code and a confirmation command code of an erased state are sequentially supplied from the outside to the prior art electrically erasable and programmable read only memory device as by steps S2 and S3. In response to the erasing command, an extremely high voltage level is supplied to the source nodes of all the floating gate type field effect transistors for a predetermined time period which is much shorter than a certain time period which is long enough to evacuate all the electrons, and part of the electrons are evacuated from the floating gate electrodes. Thus, all of the floating gate type field effect transistors start on a transition toward the erased state, and wait 10 milliseconds as in step S4.

After the lapse of time, an inspection command code is supplied from the outside to the prior art electrically erasable and programmable read only memory device as by step S5, and the prior art electrically erasable and programmable read only memory device starts an inspection sequence to see whether or not all of the floating gate type field effect transistors enter the erased state. Namely, an address signal indicative of the first memory cell block is produced, and the data byte is read out from the first memory cell block as by step S6. The prior art electrically erasable and programmable read only memory device examines whether or not the data byte thus read out from the first memory cell block is "$FF_H$" as in step S7. The answer to step S7 is firstly given negative, because the extremely high voltage level is merely supplied to the source nodes over the short time period. Then, the control returns to step S2, and reiterates the loop consisting of steps S1 to S7 for repeating the short erasing operation.

If the repetition of the short erasing operation sufficiently evacuates the electrons from the floating gate electrodes, the answer to step S7 is given affirmative, and the control proceeds to step S8 to see whether or not the address signal is indicative of the final address. The answer to step S8 is given negative at the first inquiry, because the address signal was indicative of the first memory cell block. Then, the address signal is incremented as by step S9, and becomes indicative of the second memory cell block. The control returns to step S5, and reiterates the loop consisting of steps S5 to S9 until the address signal is indicative of the final address. Of course, if the answer to step S7 is given negative again, the control returns to step S2, and restarts the short erasing operation again. Therefore, the control repeats the loop consisting of steps S2 to S7 and the loop consisting of steps S5 to S9 until the answer to step S8 is given affirmative, and a read-out command code is finally supplied from the outside to the prior art electrically erasable and programmable read only memory device as by step S10.

In the first erasing sequence, when the data byte is changed from "$00_H$" to "$FF_H$", the control confirms the erased state of the memory cells, and, for this reason, the inspection of the memory cell array is carried out with only the threshold level of an output inverter. However, the memory cells are never uniform in evacuation characteristics, and the short erasing operation tends to be repeated on the memory cells assigned early addresses, because the negative answer to step S7 causes the control to return to step S2. In other words, the memory cells assigned early addresses are more liable to enter the excessively erased state, and the inspection does not detect the excessively erased state, because the excessively erased state gives the affirmative answer to step S7.

The second erasing sequence shown in FIG. 2 starts the with supply of an automatic erasing command code to the prior art electrically erasable and programmable read only memory device as by step S11. Then, the prior art electrically erasable and programmable read only memory device automatically produces a status signal indicative of entry into the automatic erasing operation, and carries out the following erasing sequence without any external command code. Namely, the internal address signal is set to the first address, and data byte "$00_H$" is written into the memory cell block assigned the first address as by step S12. The control proceeds to step S13, and checks to see whether or not the address signal is indicative of the final address. Since the data byte "$00_H$" was written into the memory cell block assigned the first address, the answer to step S13 is given negative, and the address is incremented as by step S14. After the address is incremented, the control returns to step S12, and reiterates the loop consisting of steps S12 to S14 until the answer to step S13 is given affirmative.

When the data byte "$00_H$" is written into all the memory cell blocks, the answer to step S13 is given affirmative, and the control proceeds to step S15. In step S14, an extremely high erasing voltage level is applied to the source nodes of all the memory cells for a short time period, and, accordingly, the short erasing operation is carried out on all of the memory cells. The internal address signal is set to the first address, and the data byte is read out from the memory cell block assigned the first address to see whether or not the data byte is changed to "$FF_H$" as by step S16 The single short erasing operation hardly evacuates a large amount of electrons from the floating gate electrode of each memory cell, and the answer to step S16 is firstly given negative. With the negative answer, the control returns to step S15, and repeats the loop consisting of steps S15 and S16 until the data byte is changed to "$FF_H$". When the data byte read out from the first address is changed to "$FF_H$", the answer to step S16 is given affirmative, and the control checks to see whether or not the current address is final as by step S17. Since the address signal was set to the first address at step S15, the answer to step S17 is given negative, and the address is incremented as by step S18. After the address is incremented, the control returns to step S16, and checks to see whether or not the data byte read out from the second address is changed to "$FF_H$". Thus, the control reiterates the loop consisting of steps S16 to S18 until all of the data bytes are changed to "$FF_H$". However, if any data byte has not been changed to "$FF_H$" yet, the answer to step S16 is given negative again, and the control returns to step S15 so as to restart the short erasing operation.

However, if all of the data bytes are changed to "$FF_H$", the answers to steps S16 and S17 are given affirmative, and the control proceeds to step S19 for producing a status signal indicative of completion of the automatic erasing operation. The previous status signal indicative of the entry into the automatic erasing operation is canceled as by step S20.

Although no external command code is supplied from the outside during the automatic erasing sequence, the inspection is also carried out to see whether or not the read-out data bytes are changed to "$FF_H$", and only the logic level of the read-out data byte is monitored. Since the short erasing operation at step S15 tends to be repeated on the memory cells assigned early addresses, the memory cells assigned the early addresses are more liable to enter the excessively erased state, and the inspection hardly finds the excessively erased state as similar to the first sequence.

SUMMARY OF THE INVENTION

It is therefore an important object of the present invention to provide an electrically erasable and programmable read only memory device which is free from the excessively erased state.

To accomplish the object, the present invention proposes to check memory cells to see whether or not the threshold levels fall within a predetermined range.

In accordance with the present invention, there is provided an electrically erasable and programmable read only memory device having an erasing mode, a programming mode and a read-out mode of operation, comprising: a) a plurality of memory cells selectively entering an erased state and a write-in state, each memory cell being different in threshold level between the erased state and the write-in state; b) an addressing means responsive to an address signal indicative of at least one memory cell in the erasing mode, the programming mode and the read-out mode of operation; c) a programming means activated in the erasing mode and the programming mode of operation, and operative to allow the at least one memory cell to enter into the write-in state; d) an erasing means activated in the erasing mode of operation, and operative to cause the plurality of memory cells to approach the erased state through an incomplete erasing; e) a read-out means activated in the read-out mode and the erasing mode of operation, and operative to check to see whether the threshold level of the at least one memory cell is indicative of the erased state or the write-in state; f) an inspection means activated in the erasing mode of operation, and operative to carry out an inspection for checking the plurality of memory cells to see whether or not actual threshold levels thereof are indicative of the erased state without entry into an excessively erased state; and g) a controlling means activated in the erasing mode of operation, and operative to control an erasing sequence where the write-in means causes all of the memory cells to enter the write-in state, the erasing means carries out the short erasing, the inspection means carries out the inspection, and the short erasing and the inspection are repeated until the plurality of memory cells enter the erased state without entering the excessively erased state.

BRIEF DESCRIPTION OF THE DRAWINGS

The feature and advantages of the electrically erasable and programmable read only memory device according to the present invention will be more clearly understood from the following description taken in conjunction with the accompanying drawings in which.

DESCRIPTION OF THE PREFERRED EMBODIMENTS

First Embodiment

Figure 1:
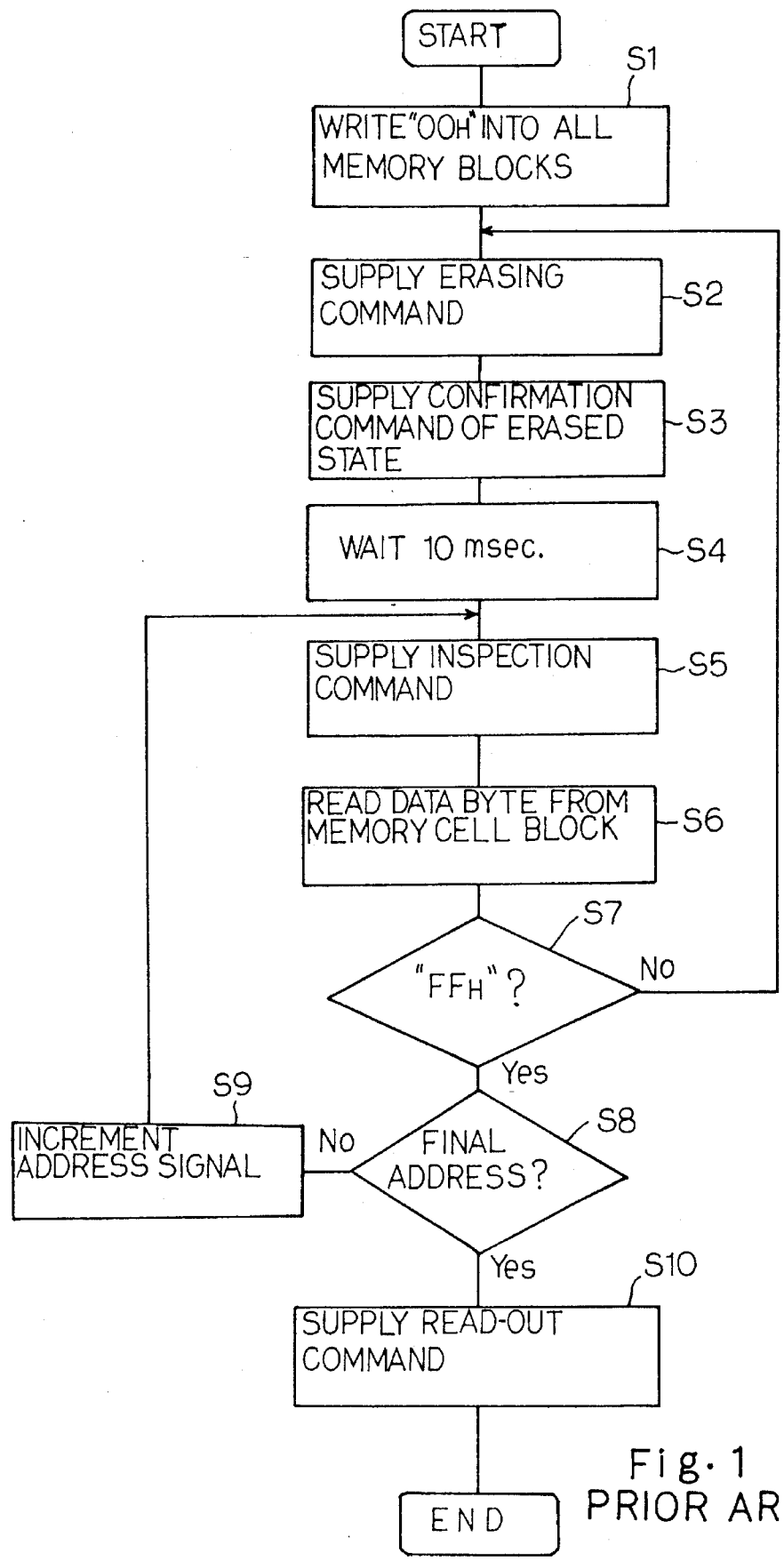
FIG. 1 is a flowchart showing the prior art erasing sequence proposed in the IEEE Journal of Solid-State Circuits.
Figure 2:
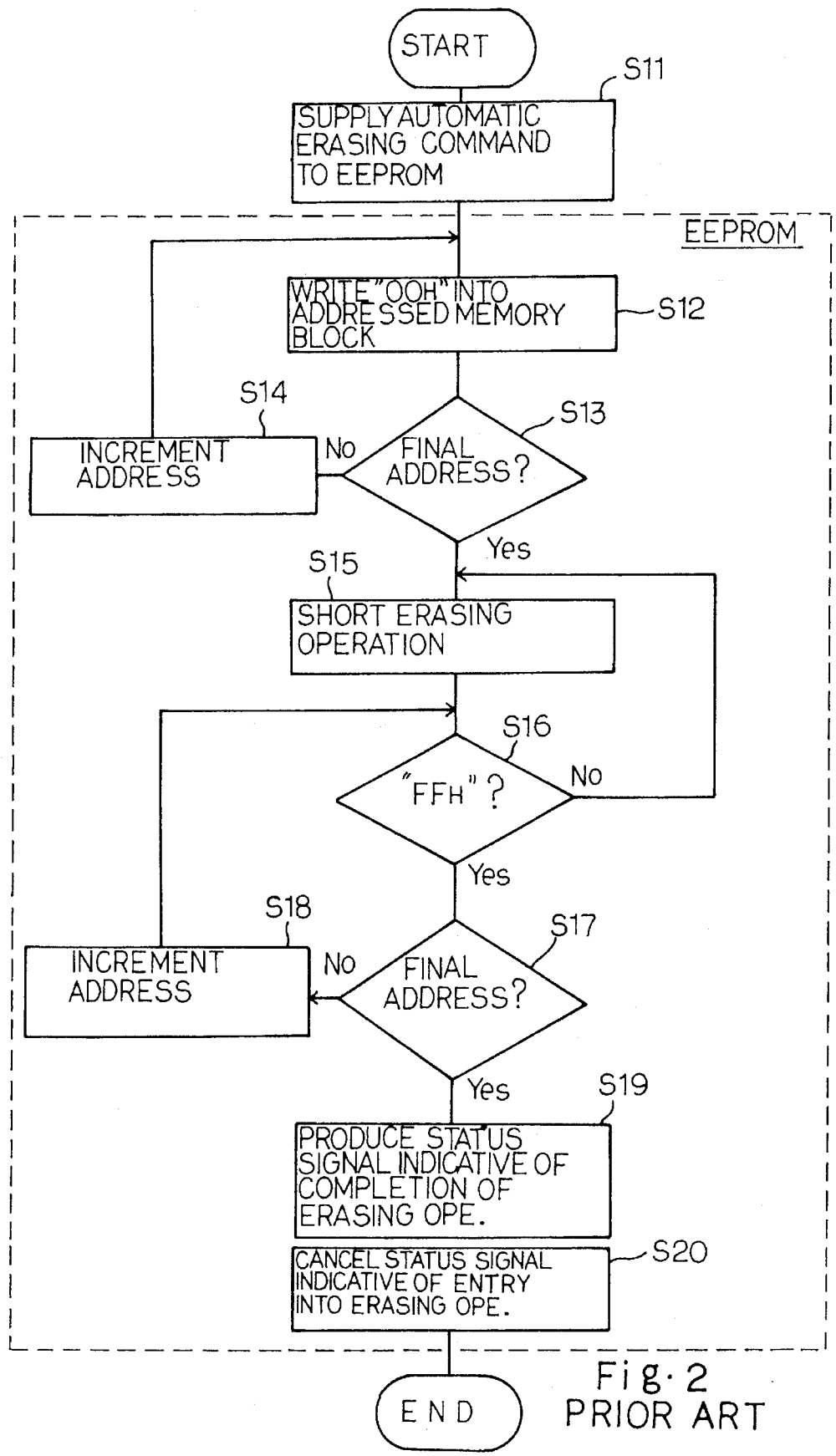
FIG. 2 is a flowchart showing the prior art erasing sequence proposed in the Sympo. VLSI Circuit Dig. Tech. Papers.
Figure 3:
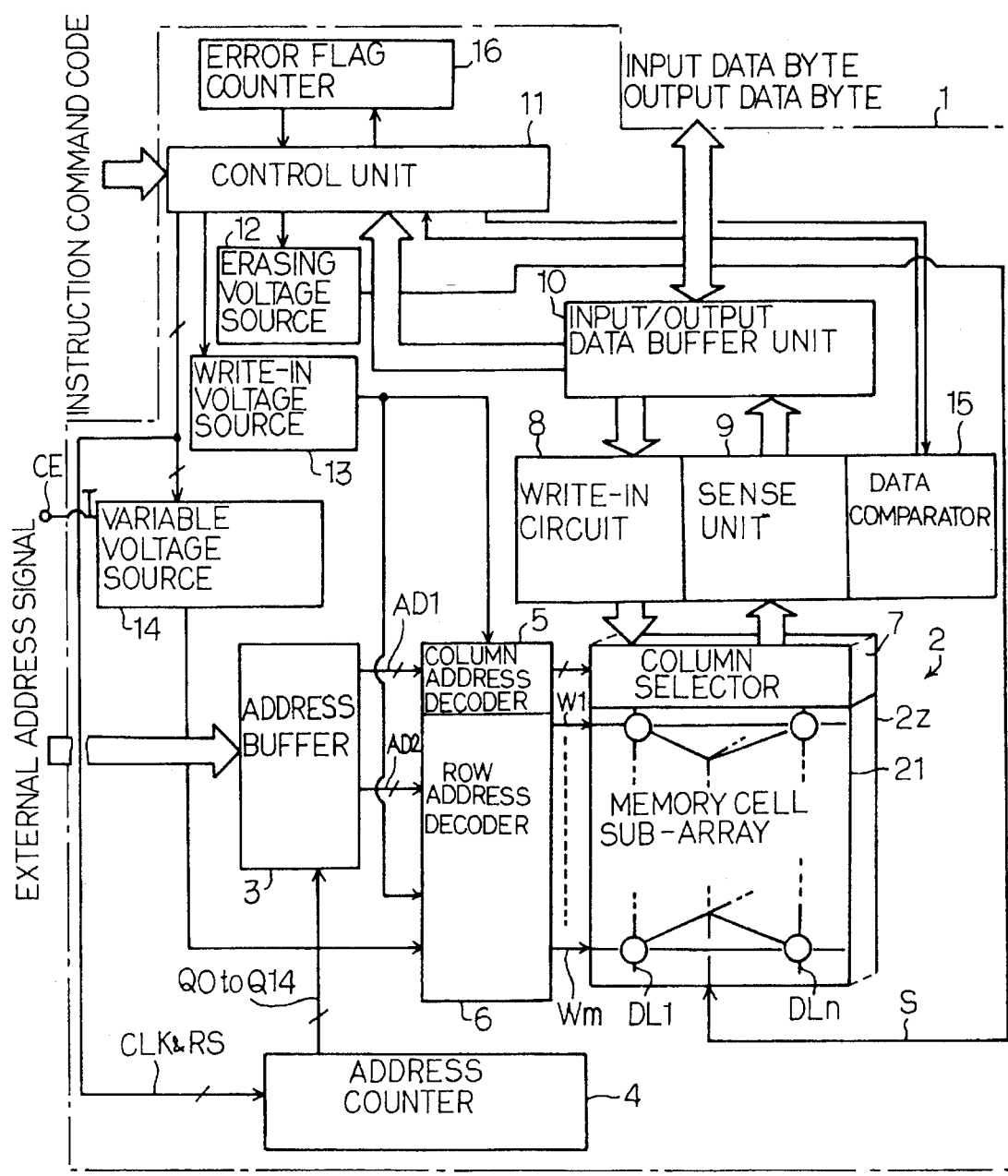
FIG. 3 is a block diagram showing the arrangement of an electrically erasable and programmable read only memory device according to the present invention.

Referring to FIG. 3 of the drawings, a flash write electrically erasable and programmable read only memory device embodying the present invention is fabricated on a single semiconductor chip 1, and the flash write electrically erasable and programmable read only memory device selectively enters an automatic erasing mode, a programming mode and a read-out mode of operation.

The flash write electrically erasable and programmable read only memory device comprises a memory cell array 2 which is broken down into a plurality of memory cell sub-arrays 21 to 2z. Each of the memory cell sub-arrays 21 to 2z is implemented by floating gate type field effect transistors respectively serving as memory cells. Although only four memory cells are shown in FIG. 3, a large number of memory cells are incorporated in each of the memory cell sub-arrays 21 to 2z, and small circles stand for the four memory cells. The memory cells of each memory cell sub-array are arranged in rows and columns, and row addresses and column addresses are respectively assigned to the rows and the columns. Word lines W1 to Wm are associated with the rows of the memory cell array 2, and are coupled with the control gate electrodes of the floating gate type field effect transistors in the associated rows. A plurality of sets of digit lines DL1 to DLn are associated with the columns of the memory cell array 2, and are coupled with the drain nodes of the floating gate type field effect transistors in the associated columns. One of the word lines W1 to Wm and a set of digit lines defines a memory cell block, and a data byte is stored in the memory cell block. A source line S is shared between all of the memory cells, and is coupled with the source nodes of the floating gate type field effect transistors. In the following description, logic "1" level and logic "0" level respectively correspond to high and low voltage level except for the relation between the voltage level on a digit line and the logic level of a data bit thereon.

An address buffer unit 3 is coupled with an address counter 4 as well as with address pins (not shown), and an external address signal and an internal address signal Q0 to Q14 are selectively supplied to the address buffer unit 3. The address buffer unit 3 produces address predecoded signals AD1 and AD2, and the address predecoded signals AD1 and AD2 are respectively supplied to a column address decoder unit 5 and a row address decoder unit 6. The plurality of sets of digit lines DL1 to DLn are coupled with a column selector unit, and the column address decoder unit 5 causes the column selector unit 7 to select a set of digit lines DL1, . . . or DLn. The selected set of digit lines are selectively coupled through the column selector unit 7 with a write-in circuit 8 and a sense unit 9 depending upon the operation mode, and an input/output data buffer unit 10 is also selectively coupled with the write-in circuit 8 and the sense unit 9. The sense unit 9 is implemented by a plurality of differential amplifier circuits respectively associated with corresponding digit lines of the selected set, and quickly discriminates logic levels of data bits read out from the memory cell sub-arrays 21 to 2z to the selected set of digit lines. The input/output data buffer unit 10 in turn is coupled with input/output data pins (not shown), and an input data byte and an output data byte are transferred between the input/output data pins and the input/output data buffer unit 10.

The flash write electrically erasable and programmable read only memory device further comprises a control unit 11, and an instruction command code is supplied to the control unit 11. An erasing voltage source 12, a write-in voltage source 13, a variable voltage source 14, a data comparator 15, an error flag counter unit 16 and the address counter 4 are under the control of the control unit 11, and the control unit 11 causes the flash write electrically erasable and programmable read only memory device to selectively enter the automatic erasing mode, the programming mode and the read-out mode of operation.

The erasing voltage source 12 is coupled with the source line S shared between all of the floating gate type field effect transistors, and supplies an erasing pulse of 12 volts to the source line S in the automatic erasing mode of operation. When the erasing pulse is applied to the source nodes of the floating gate type field effect transistors, Fowler-Nordheim tunneling current flows across the thin gate insulating films, and electrons are partially evacuated from the floating gate electrodes. When the electrons are sufficiently evacuated from the floating gate electrodes, the floating gate type field effect transistors simultaneously enter erased states, and the threshold levels thereof are lowered to a low level. However, the source line S is kept at the ground voltage level in both programming and read-out modes of operation.

The write-in voltage source 13 produces write-in voltage levels of 9 volts and 14 volts, and the write-in voltage level is distributed to the column address decoder unit 5 and the row address decoder unit 6. In the automatic erasing and programming modes of operation, the column address decoder unit 5 selectively lifts the decoded signal lines thereof, and allows the write-in circuit 8 to selectively lift a selected set of digit lines to 14 volts depending upon the bit string of a write-in data byte stored in the input/output data buffer unit 10. The row address decoder unit 6 selectively drives the word lines W1 to Wm to 14 volts. The digit lines selected by the input data byte propagate the write-in voltage level at 14 volts to the drain nodes of the floating gate type field effect transistors coupled therewith, and hot electrons take place at the p-n junction of the drain nodes. The hot electrons are attracted to the selected word line of 14 volts, and are accumulated in the floating gate electrodes of the floating gate type field effect transistors coupled with the selected word lines. The injected electrons allow the threshold levels of the floating gate type field effect transistors to go up to high level, and the floating gate type field effect transistors enter a write-in state.

The variable voltage source 14 produces a first criterion voltage level at 3.4 volts and a second criterion voltage level at 1.0 volt both used in the automatic erasing mode of operation. The variable voltage source 14 further produces a third criterion voltage level at 7.6 volts, and the third criterion voltage level is used for confirmation of the write-in state. The first criterion voltage level is sequentially applied to the word lines W1 to Wm, and checks the floating gate type field effect transistors to see whether or not the associated floating gate type field effect transistors turn on. In other words, the data bits read out therefrom are changed from logic "0" level to logic "1" level. The second criterion voltage level is also sequentially applied to the word lines W1 to Wm to see whether or not the associated floating gate type field effect transistors enter depletion mode. In other words, the second criterion voltage level is available for detecting excessively erased states. The third criterion voltage level is also sequentially supplied to the word lines W1 to Wm, and confirms that the floating gate type field effect transistors are surely turned off. The third criterion voltage level is also used in the automatic erasing mode as described hereinafter. However, the third criterion voltage level may be used in the programming mode of operation, and an input data byte in the input-output data buffer unit 10 may be compared with the read-out data byte at the data comparator 15 after the write-in operation.

Figure 4:
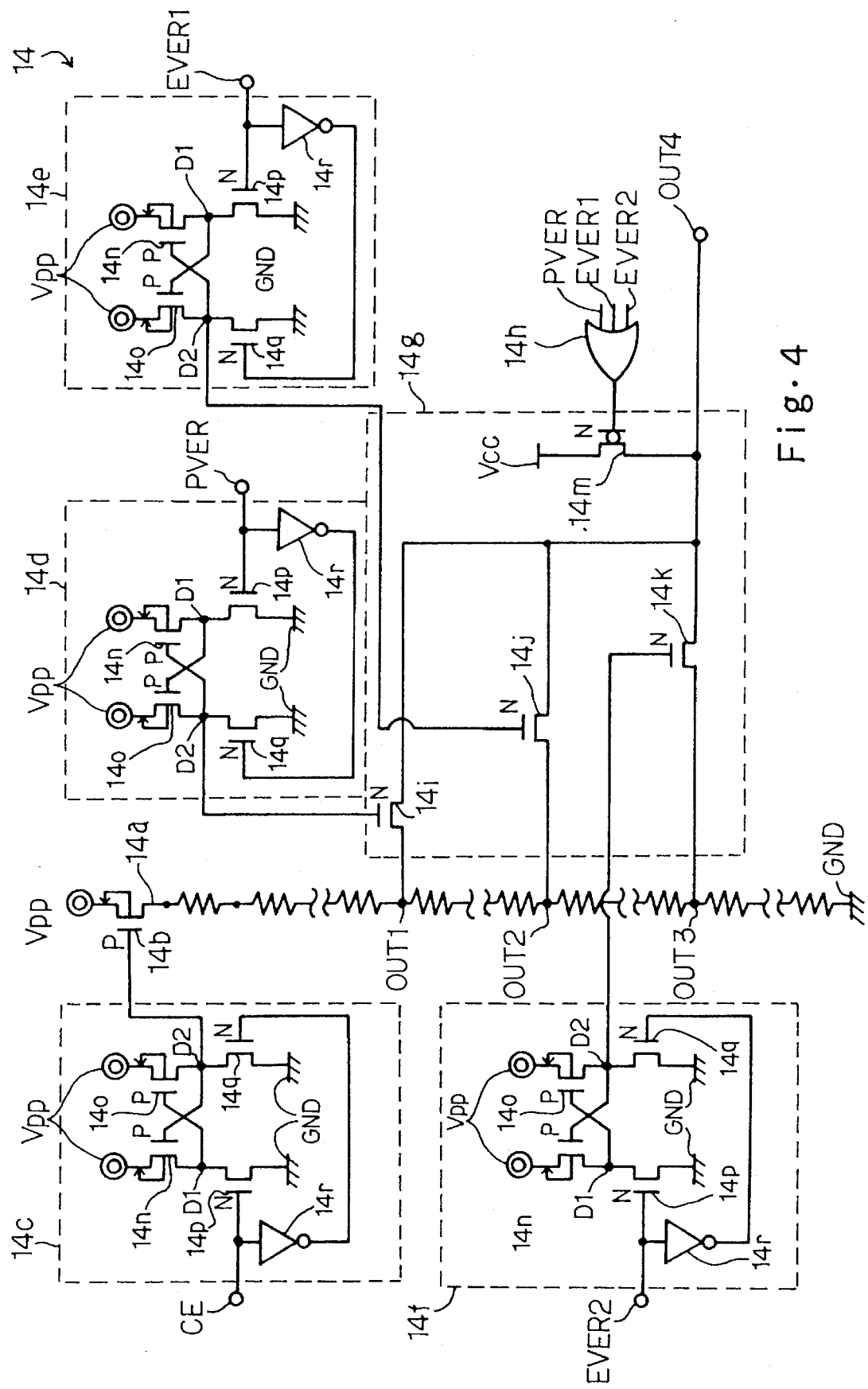
FIG. 4 is a circuit diagram showing the arrangement of a variable voltage source incorporated in the electrically erasable and programmable read only memory device.

The circuit arrangement of the variable voltage source 14 is illustrated in FIG. 4 in detail, and largely comprises a string of resistors 14a associated with a p-channel enhancement type switching transistor 14b, four step-up circuits 14c, 14d, 14e and 14f, a switching array 14g and an OR gate 14h. The p-channel enhancement type switching transistor 14b and the string of resistors 14a are coupled in series between a source of extremely high voltage level Vpp and a ground voltage line GND, and the extremely high voltage level Vpp is as high as 12 volts. The p-channel enhancement type switching transistor 14b is gated bt the step-up circuit 14c, and the string of registers 14a has three output nodes OUT1, OUT2 and OUT3. The switching array 14g has three n-channel enhancement type switching transistors 14i, 14j and 14k coupled in parallel between the output nodes OUT1, OUT2 and OUT3 and an output node OUT4 of the variable voltage source 14, and an n-channel depletion type switching transistor 14m coupled between a source of power voltage level Vcc and the outpout node OUT4. The source of power voltage level Vcc applies a power voltage level of 5 volts. The step-up circuits 14c to 14f are similar in arrangement to one another, and each of the step-up circuits 14c to 14f comprises two inverters or two series combinations of p-channel enhancement type field effect transistors 14n/14o and n-channel enhancement type field effect transistors 14p/14q, and an inverter 14r. The two series combinations are coupled between the source of extremely high voltage level Vpp and the ground voltage line GND, and the common drain nodes D1 and D2 are coupled with the gate electrodes of the p-channel enhancement type field effect transistors 14o and 14n, respectively. A chip enable signal CE is directly supplied to the gate electrode of the n-channel enhancement type field effect transisor 14p of the step-up circuit 14c, and the complementary chip enable signal is supplied from the inverter 14r to the gate electrode of the n-chanel enhancement type field effect transistor 14q. The common drain node D2 serves as the output node of the step-up circuit 14c, and is coupled with the gate electrode of the p-channel enhancement type switching transistor 14b. Therefore, when the chip enable signal CE goes down to the ground voltage level, the inverter 14r allows the n-channel enhancement type field effect transistor 14q to turn on. The n-channel enhancement type field effect transistor 14q supplies the ground voltage level to the common drain node D2 and, accordingly, to the gate electrode of the p-channel enhancement type switching transistor 14b, and the p-channel enhancement type switching transistor 14b turns on to couple the source of extremely high voltage level to the string of resistors 14a. However, if the chip enable signal CE is returned to inactive high voltage level, the common drain node D2 goes up to the extremely high voltage level Vpp, and the p-channel enhancement type switching transistor 14b isolates the string of resistors 14a from the source of extremely high voltage level Vpp.

The other step-up circuits 14d to 14f and the OR gate 14h are associated with the switching array 14g for changing the voltage level at the output node OUT4 under the control of the control unit 11, and are coupled with the gate electrodes of the n-channel enhancement type switching transistors 14i to 14k and the gate electrode of the n-channel depletion type switching transistor 14m, respectively. Namely, the step-up circuits 14d to 14f are respectively responsive to control signals PVER, EVER1 and EVER2, and these control signals PVER, EVER1 and EVER2 are further supplied to the OR gate 14h. The control signals PVER, EVER1 and EVER2 are respectively indicative of the third, first and second criterion voltage levels, and the control unit selectively lifts the control signals PVER, EVER1 and EVER2 to the active high voltage level. Namely, if the control signal PVER goes up to the active high voltage level, the common drain node D2 of the step-up circuit 14d is elevated to the extremely high voltage level Vpp, and allows the n-channel enhancement type switching transistor 14i to turn on for coupling the output node OUT1 with the output node OUT4.

Since the voltage level at the output node OUT1 is regulated to 7.6 volts, the third criterion voltage level of 7.6 volts takes place at the output node OUT4. However, if the control signal EVER1 goes up to the active high voltage level, the step-up circuit 14e allows the common drain node D2 to go up to the extremely high voltage level Vpp, and, accordingly, the n-channel enhancement type switching transistor 14j turns on for coupling the output node OUT2 with the output node OUT4. The output node OUT2 is regulated to 3.4 volts, and the first criterion voltage level takes place at the output node OUT4. The control signal EVER2 of the active high voltage level causes the step-up circuit 14f to lift the common drain node D2 to the extremely high voltage level Vpp, and the n-channel enhancement type switching transistor 14k turns on to relay the voltage level at the output node OUT3 to the output node OUT4. The voltage level at the output node OUT3 is regulated to 1.0 volt, and the second criterion voltage level is produced at the output node OUT4. While any one of the control signals PVER, EVER1 and EVER2 is in the active high voltage level, the OR gate 14h supplies the high voltage level to the gate electrode of the n-channel depletion type switching transistor 14m, and the output node OUT4 is isolated from the source of power voltage level Vcc. However, if all of the control signals PVER, EVER1 and EVER2 remain in the inactive low voltage level, the OR gate 14h supplies the ground voltage level to the gate electrode of the n-channel depletion type switching transistor 14m, and the power voltage level Vcc of 5.0 volts is supplied to the output node OUT4. The power voltage level of 5.0 volts is selectively supplied to the word lines W1 to Wm for reading out a data byte from a memory cell block. Thus, the various voltage levels are produced at the output node OUT4 under the control of the control unit 11, and are selectively supplied to the row address decoder unit 6.

Figure 5:
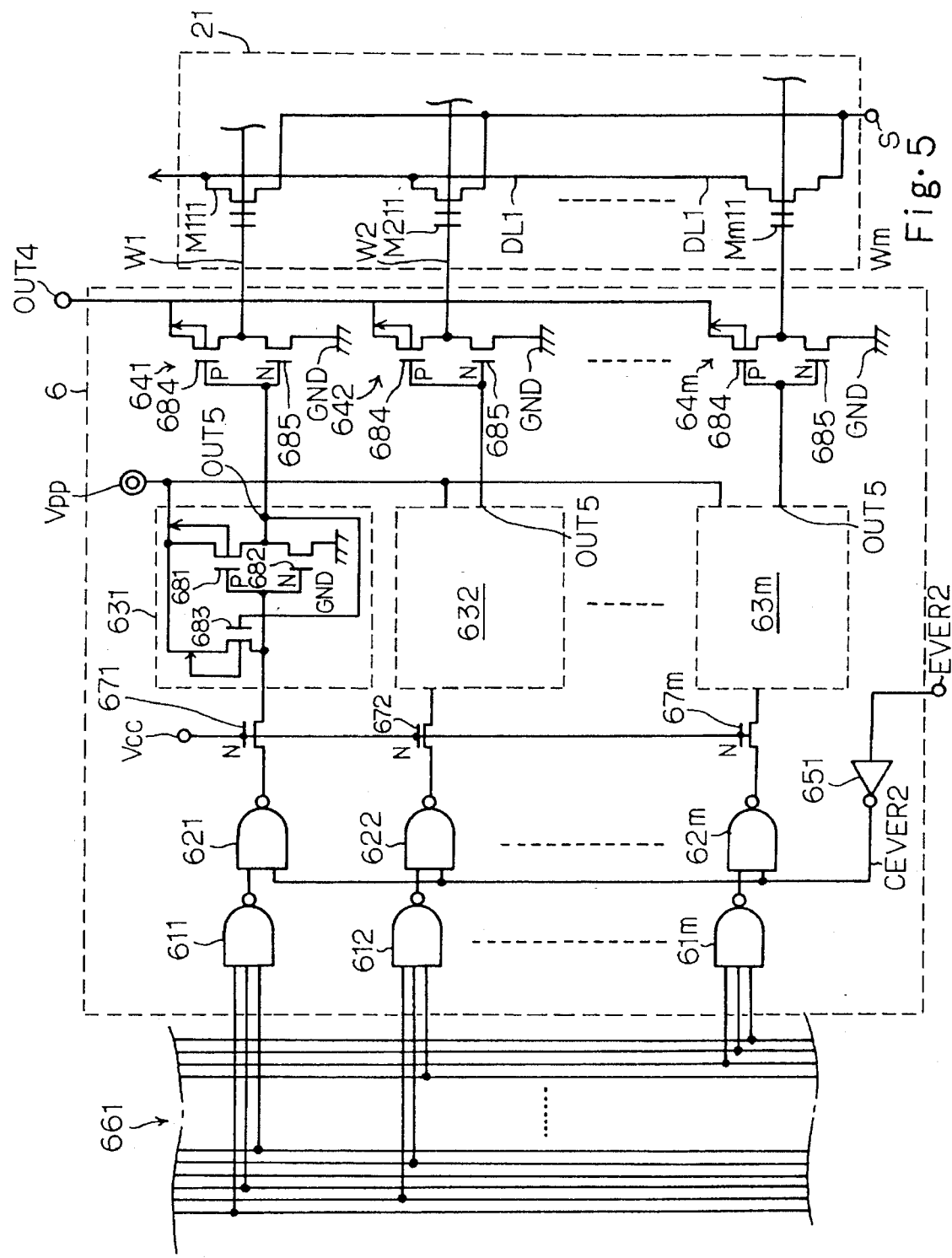
FIG. 5 is a circuit diagram showing a row address decoder unit incorporated in the electrically erasable and programmable read only memory device.

Turning to FIG. 5 of the drawings, the circuit arrangement of the row address decoder unit 6 is illustrated in detail, and the word lines W1, W2 and Wm are coupled between the row address decoder unit 6 and the memory cells M111, M211, . . . and Mm11 associated with the digit line DL1. The row address decoder unit 6 comprises a plurality of first NAND gates 611, 612, . . . and 61m, a plurality of second NAND gates 621, 622, . . . and 62m, a plurality of inverters 631, 632, . . . and 63m, a plurality of output inverters 641, 642, . . . and 64m, and an inverter 651. The first NAND gates 611 to 61m are selectively coupled with the address predecoded signal lines 661 which propagate the address predecoded signal AD2 thereto, and the address predecoded signal AD2 allows only one of the first NAND gates 611 to 61m to yield an output signal of the low voltage level. However, the other first NAND gates continuously supply output signals of the high voltage level. The second NAND gates 621 to 62m are respectively coupled with the first NAND gates 611 to 61m, and are enabled with the complementary signal CEVER2 of the control signal EVER2. Namely, while the control signal EVER2 indicative of the second criterion voltage level is not supplied from the control unit 11, the second NAND gates 621 to 62m are enabled and responsive to the output signals of the first NAND gates 611 to 61m and, accordingly, the address decoded signal AD2. Therefore, one of the second NAND gates 621 to 62m produces an output signal of the high voltage level, and the other second NAND gates keep the output signals thereof low. However, if the control signal EVER2 goes up to the high voltage level in the automatic erasing mode of operation, the complementary signal CEVER2 goes down to the low voltage level, and all of the second NAND gates 621 to 62m shifts the output signals thereof to the high voltage level. N-channel enhancement type field effect transistors 671, 672, . . . and 67m are coupled between the second NAND gates 621 to 62m and the inverters 631 to 63m, and prevents the second NAND gates 621 to 62m from the extremely high voltage level Vpp as described below.

The inverters 631 to 63m are similar in circuit arrangement to one another, and each of the inverters 631 to 63m comprises a series combination of a p-channel enhancement type field effect transistor 681 and an n-channel enhancement type field effect transistor 682 coupled between the source of extremely high voltage level Vpp and the ground voltage line GND, and a p-channel enhancement type pull-up transistor 683 coupled between the source of extremely high voltage level Vpp and the gate electrodes of the enhancement type field effect transistors 681 and 682. While the control signal EVER2 remains in the inactive low voltage level, one of the second NAND gates 621 to 62m produces the output signal of the high voltage level, and the other second NAND gates keep the output signals thereof low. The output signal of the high voltage level allows the n-channel enhancement type field effect transistor 681 to turn on, and the ground voltage level is propagated to the output node OUT5 of the inverter. The ground voltage level is relayed to the gate electrode of the p-channel enhancement type pull-up transistor 683, and allows it to turn on. Then, the extremely high voltage level Vpp is supplied to the gate electrode of the n-channel enhancement type field effect transistor 682, and keeps it in the on-state. However, the associated n-channel enhancement type field effect transistors 671 to 67m block the second NAND gates from the extremely high voltage level Vpp. The other output signals of the low voltage level cause the p-channel enhancement type field effect transistors 682 to turn on, and the extremely high voltage level Vpp is applied to the output nodes OUT5. On the other hand, if the control signal EVER2 goes up to the active high voltage level, the complementary signal CEVER2 causes all the second NAND gates 621 to 62m to produce the output signals of the high voltage level as described hereinbefore, and the output signals of the high voltage level shift all of the inverters 631 to 63m to apply the ground voltage level to the output nodes OUT5.

The output inverters 641 to 64m are similar in circuit arrangement to one another, and each of the output inverters 641 to 64m is implemented by a series combination of a p-channel enhancement type field effect transistor 684 and an n-channel enhancement type field effect transistor 685 coupled between the output node OUT4 of the variable voltage source 14 and the ground voltage line GND. As described above, one of the inverters 631 to 63m applies the ground voltage level to the output node OUT5 thereof in the absence of the control signal EVER2 of the active high voltage level, and the ground voltage level at the output node OUT5 allows the p-channel enhancement type field effect transistor 684 to turn on. Then, the output node OUT4 of the variable voltage source 14 is coupled with the associated one of the word lines W1 to Wm, and the voltage level thereat, i.e., 3.4 volts. 5.0 volts or 7.6 volts is applied to the word line. However, the extremely high voltage level Vpp at the other output node OUT5 causes the n-channel enhancement type field effect transistors 685 to turn on, and the other word lines are grounded therethrough. However, while the control signal EVER2 remains in the active high voltage level, all of the output nodes OUT5 are grounded, and all of the p-channel enhancement type field effect transistors 684 turn on to couple all of the word lines W1 to Wm with the output node OUT4 of the variable voltage source 14. Then, the word lines W1 to Wm are applied with 1.0 volt, and all of the floating gate type field effect transistors are sequentially examined to determine whether or not any one of the floating gate type field effect transistors enters the excessively erased state.

Turning back to FIG. 3 of the drawings, the data comparator unit 15 is provided in association with the sense unit 9, and is enabled in the automatic erasing mode of operation. The data comparator 15 compares the read-out data bits with an expected logic level. Namely, while the first criterion voltage level is sequentially applied to the word lines W1 to Wm, the read-out data bits are expected to be logic "1" level, and a data bit of logic "0" level is indicative of a substantial amount of electrons still accumulated in the floating gate electrode of the memory cell. Therefore, the expected logic level in the confirmation of the erased state is logic "1" level. On the other hand, while the second criterion voltage level is sequentially applied to the word lines W1 to Wm, a properly erased floating gate type field effect transistor remains off, and the read-out data bit therefrom is logic "0" level. However, if a floating gate type field effect transistor undesirably enters the excessively erased state, the floating gate type field effect transistor is turned on, and the read-out data bit is logic "1" level. Therefore, the expected logic level in the properly erased state is logic "0" level.

The address counter 4 is responsive to a clock pulse CLK supplied from the control unit 11 in the automatic erasing mode of operation, and the internal address signal is incremented to sequentially indicate the row and column addresses. With the row and column addresses indicated by the internal address signal, not only a write-in data byte is sequentially written into the memory cell blocks but also data bytes are sequentially read out from the memory cell blocks in the automatic erasing mode of operation. However, a write-in data byte is addressed to a memory cell block indicated by the external address signal, and a data byte is read out from the memory cell block with an address matched with the external address signal.

Figure 6:
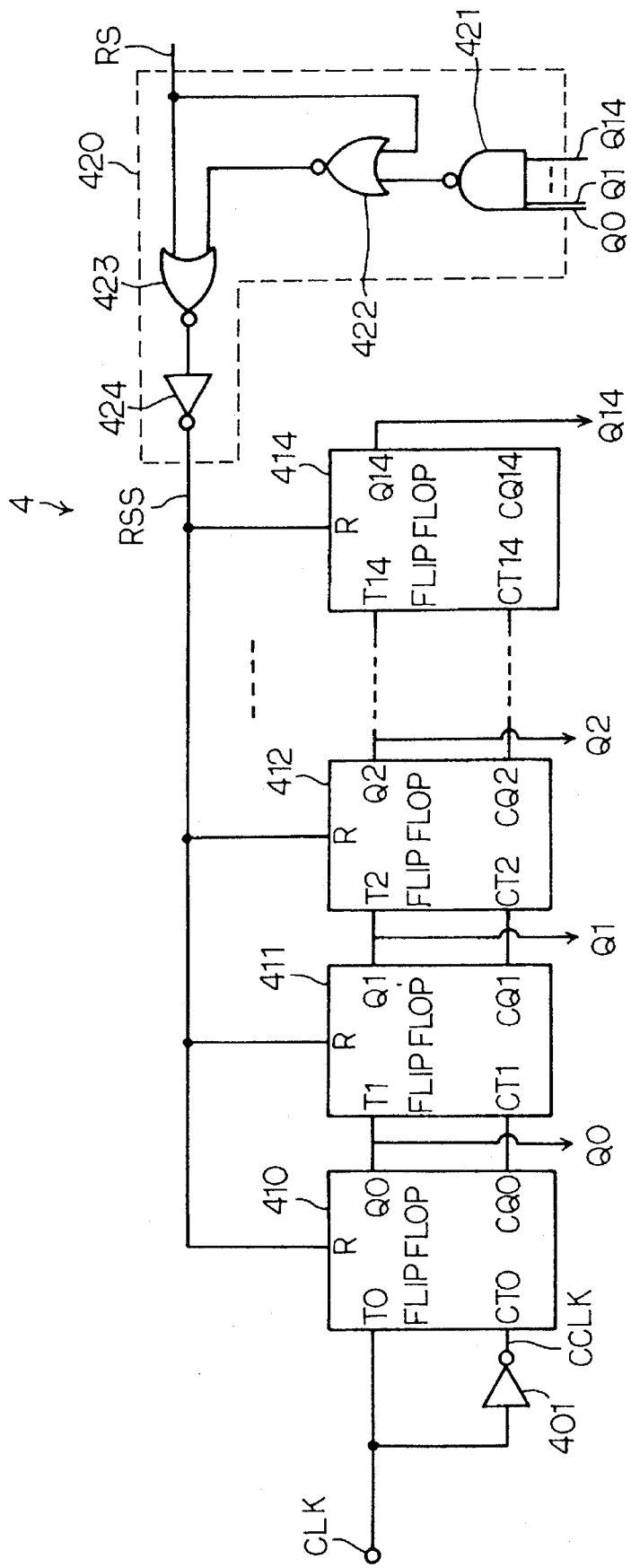
FIG. 6 is a circuit diagram showing the arrangement of an address counter unit incorporated in the electrically erasable and programmable read only memory device.

As described above, the address counter unit 4 is incremented with the clock signal CLK supplied from the control unit 11 in the automatic erasing mode of operation, and the address counter unit 4 supplies the internal address signal Q0 to Q14 to the address buffer unit 3. FIG. 6 illustrates the circuit arrangement of the address counter 4, and the address counter unit 4 comprises an inverter 401, flip flop circuits 410 to 414 coupled in cascade, and a control circuit 420. The inverter 401 produces the complementary clock signal CCLK from the clock signal CLK, and the clock signal CLK and the complementary clock signal CCLK are supplied to the input node T0 and the complementary input node CT0 of the first flip flop circuit 410. The output nodes Q0 to Q13 and the complementary output nodes CQ0 to CQ13 are coupled with the input and complementary input nodes T1 to T14 and CT1 to CT14 of the next flip flop circuits 411 to 414, and the internal address signal Q0 to Q14 takes place at the output nodes Q0 to Q14 of the flip flop circuits 410 to 414. The reset nodes R of the flip flop circuits 410 to 414 are coupled with the control circuit 420.

Figure 7:
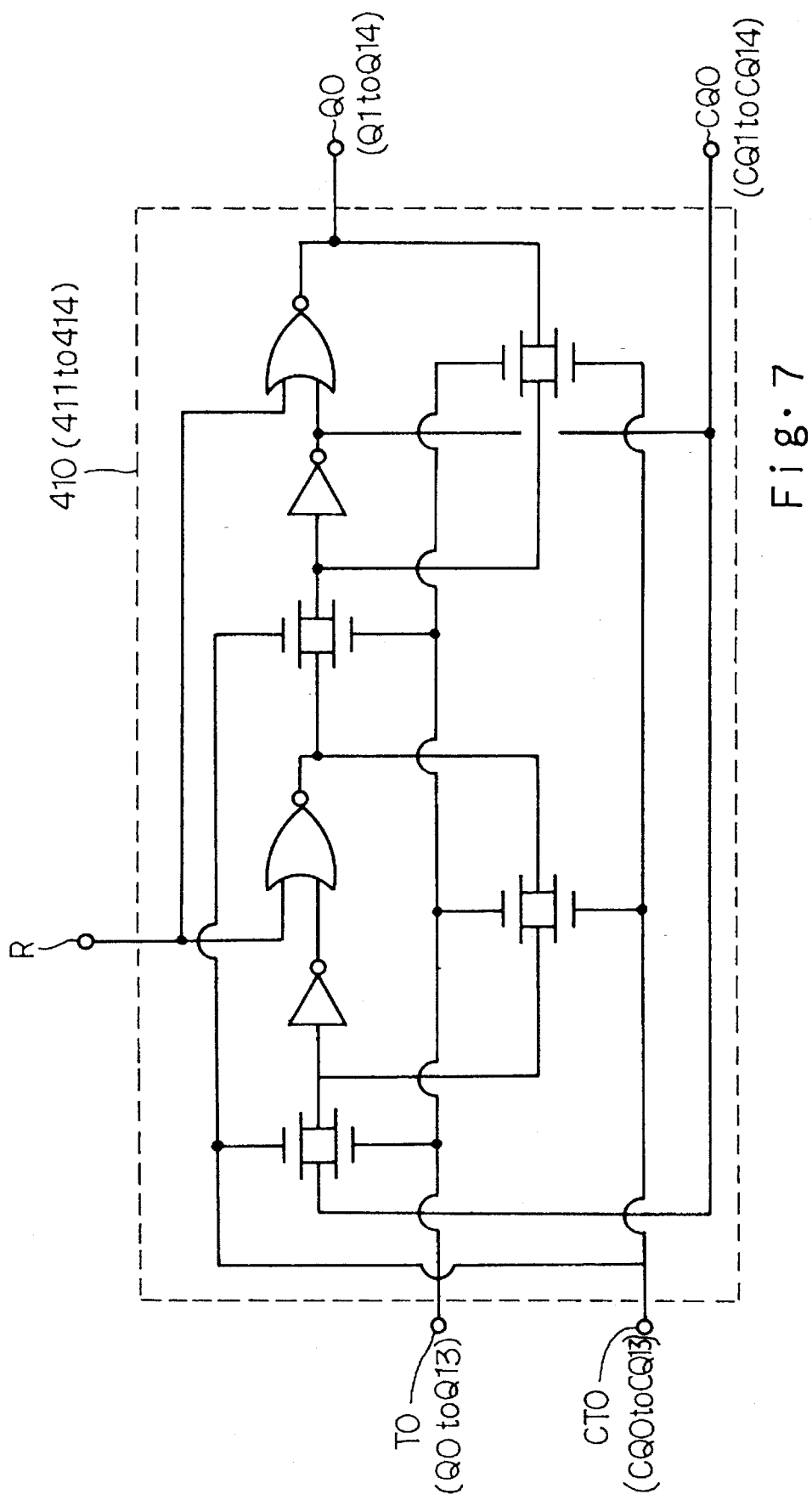
FIG. 7 is a circuit diagram showing the arrangement of a flip flop circuit incorporated in the address counter unit.

FIG. 7 illustrates the circuit arrangement of each of the flip flop circuits 410 to 414, and each flip flop circuit is responsive to the clock signal CLK (or the output signal Q0 to Q13) and the complementary clock signal CCLK (or the complementary output signal (CQ0 to CQ13) so that the pulse width at the output node thereof is doubled with respect to that at the input node thereof. Therefore, the flip flop circuit 410 is assigned to the least significant bit of the internal address signal Q0, and the flip flop circuit 414 controls the most significant bit of the internal address signal Q14.

Turning back to FIG. 6 of the drawings, the control circuit 420 comprises a NAND gate 421, two NOR gates 422 and 423 and an inverter 424, and the bits of the internal address signal Q0 to Q14 are fed back to the input nodes of the NAND gate 421. A reset signal RS is supplied from the control unit 11 to the NOR gates 422 and 423, and the NAND gate 421 supplies the output signal thereof to the NOR gate 422. The NOR gate 422 further supplies the output signal to the NOR gate 423, and the reset signal RS is NORed with the output signal of the NOR gate 422. The output signal of the NOR gate 423 is supplied to the inverter 424, and the inverter 424 distributes the secondary reset signal RSS to the reset nodes R of the flip flop circuits 410 to 414.

Figure 8:
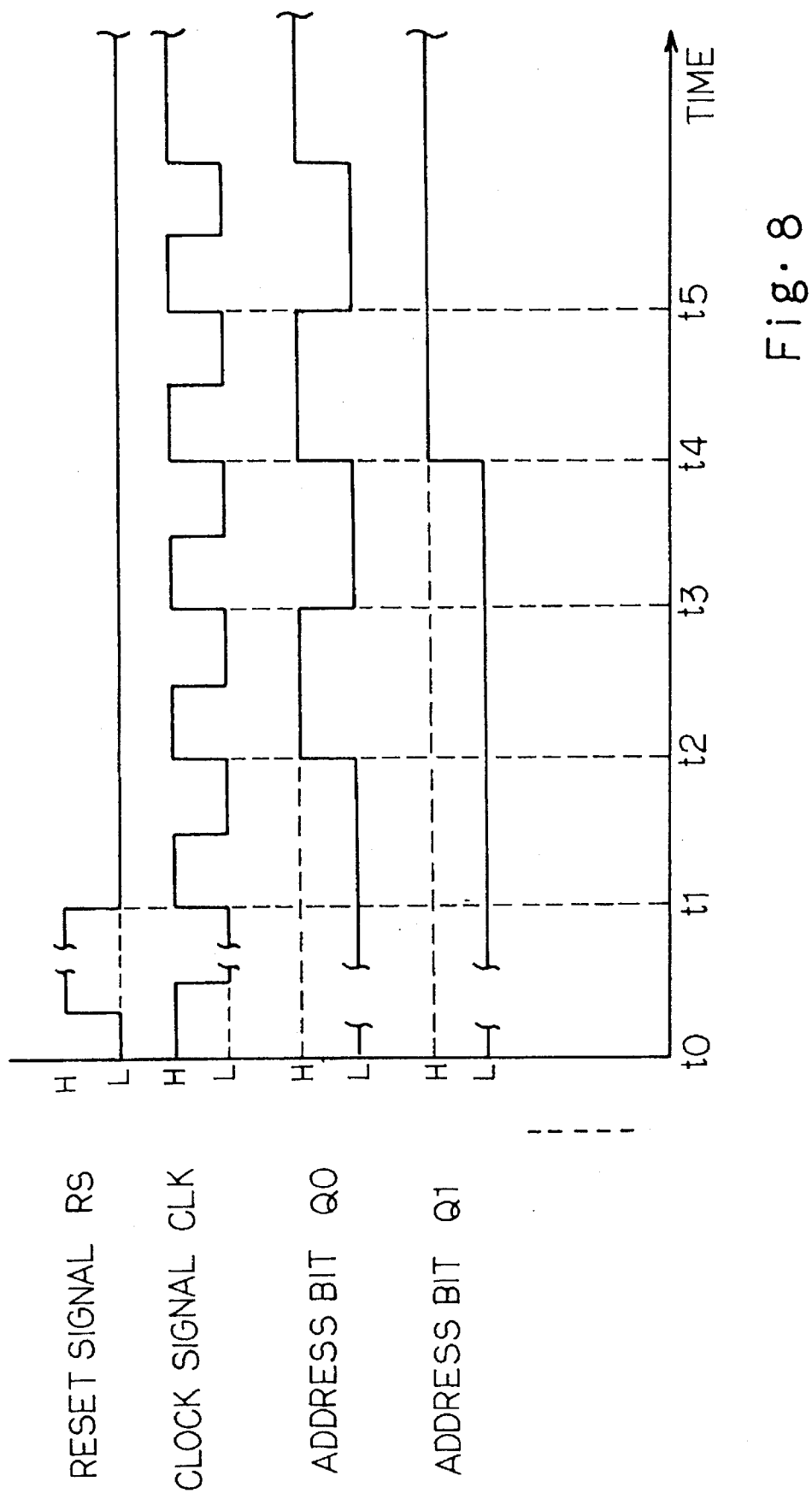
FIG. 8 is a timing chart showing the circuit behavior of the address counter unit.

Description is provided below of the circuit behavior of the address counter unit 4 with reference to FIG. 8. Assuming now that the reset signal RS rises between time t0 and time t1, the NAND gate 421 produces the output signal of logic "1" level because of at least one address bit of logic "0" level, and the reset signal of logic "1" level is NORed with the output signal of logic "1" level, and the NOR gate 422 yields the output signal of logic "0" level. The reset signal RS of logic "1" level is further NORed with the output signal of logic "0" level, and the NOR gate 423 yields the output signal of logic "0" level. The inverter 424 produces the secondary reset signal RSS of logic "1" level from the output signal of the NOR gate 423, and all of the flip flop circuits 410 to 414 enter the reset state with the secondary reset signal RSS. In this situation, the internal address signal is constituted by the address bits Q0 to Q14 of logic "0" level, and the NAND gate 421 keeps the output signal thereof in logic "1" level. If the reset signal RS is recovered from logic "1" level to logic "0" level at time t1, the reset signal of logic "0" level is NORed with the output signal of logic "1" level, and the NOR gate 422 yields the output signal of logic "0" level. The reset signal RS of logic "0" level is further NORed with the output signal of logic "0" level, and the NOR gate 423 produces the output signal of logic "1" level. As a result, the inverter 424 shifts the secondary reset signal RSS to inactive logic "0" level, and the flip flop circuits 410 to 414 start incrementing the internal address signal Q0 to Q14. The flip flop 410 shifts the address bit Q0 to logic "1" level at every second clock pulse at time t2 and time t4, and the flip flop circuit 411 shifts the address bit Q1 to logic "1" level at every fourth clock pulse at time t4. In this way, the flip flop circuits 412 to 414 sequentially doubles the address bits Q2 to Q14 in pulse width until the reset signal RS goes up to logic "1" level again. Thus, the internal address signal Q0 to Q14 is sequentially incremented with the clock signal CLK and the complementary clock signal CCLK, and the internal address signal Q0 to Q14 is used in confirmation of proper range as will be described below in conjunction with FIG. 9.

Turning back to FIG. 3 of the drawings, the error flag counter unit 16 is implemented by two counter circuits. The first counter circuit is incremented with a first error flag indicative of incomplete erased state, and the second counter circuit is incremented with a second error flag indicative of the excessively erased state.

In this instance, the address buffer unit 3, the address counter 4, the column address decoder unit 5, the row address decoder unit 6 and the column selector unit 7 as a whole constitute an addressing means, and write-in circuit 8, the input/output data buffer unit 10 and the write-in voltage source 13 form in combination a programming means. The erasing voltage source 12 serves as an erasing means together with the source line S, and the sense unit 9 and the input/output data buffer unit 10 as a whole constitute a read-out means. The variable voltage source 14 and the data comparator 15 form in combination an inspection means, and the control unit 11 and the error flag counter unit 16 serve as a controlling means.

A description is given below of the circuit behavior of the flash write electrically erasable and programmable read only memory device. However, the circuit behavior in the programming mode and the read-out mode is similar to the prior art electrically programmable read only memory devices, and description of these modes is omitted for the sake of simplicity.

Figure 9:
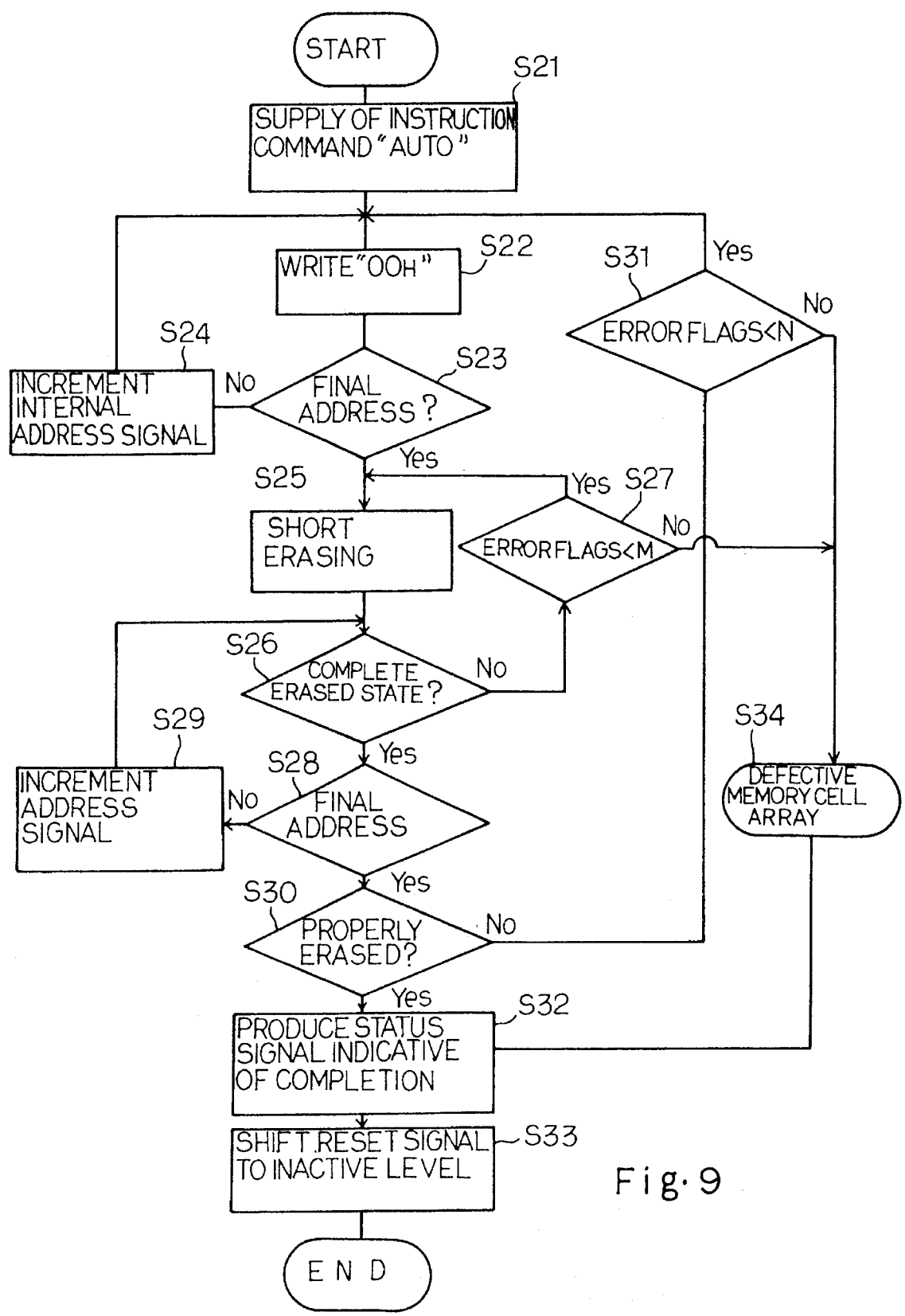
FIG. 9 is a flowchart showing the sequence of an automatic erasing mode of operation according to the present invention.

FIG. 9 shows a sequence of an automatic erasing operation according to the present invention. The automatic erasing sequence starts with supply of an instruction command code AUTO indicative of the automatic erasing mode from the outside thereof as by step S21. The control unit 11 initializes the error flag counter unit 16, and, accordingly, the counter circuits are reset to zero. A status signal is produced, and is indicative of the execution of the automatic erasing sequence. The control unit 11 activates the write-in voltage source 13 and the write-in circuit 8, and the input/output data buffer unit 10 stores a data byte "$00_H$". Moreover, the source line S is grounded so that the write-in operation is executable. The internal address counter unit 4 resets the internal address signal Q0 to Q14 to zero, and the data byte "$00_H$" is written into the memory cell block indicated by the internal address signal Q0 to Q14 as by step S22. Namely, the extremely high write-in voltage level is applied to the drain nodes of the floating gate type field effect transistors forming the memory cell block, and hot electrons are injected to the floating gate electrodes thereof. Then, the floating gate type field effect transistors enter the write-in state, and the memory cell block is checked to see whether or not the final address is assigned thereto as by step S23. Since the internal address signal was reset to zero, the answer to step S23 is given negative, and the control unit 11 allows the internal address signal Q0 to Q14 to be incremented with the clock signal CLK as by step S24. The control returns to step S22, and reiterates the loop consisting of steps S22 to S24 until the data byte "$00_H$" is written into all of the memory cell blocks. Though not shown in FIG. 9, the control unit 11 shifts the control signal PVER to the active high voltage level, and third criterion voltage level at 7.6 volts is sequentially supplied to the word lines W1 to Wm so as to confirm that all of the memory cells surely enter the write-in state.

When the data byte "$00_H$" is written into all of the memory cell blocks, the answer to step S23 is given affirmative, and the control unit 11 activates the erasing voltage source 12 for a short erasing operation as by step S25. As a result, the erasing voltage source 12 supplies the erasing pulse to the source line S. The erasing pulse is too narrow in pulse width to perfectly shift the memory cells into the erased state, and the electrons are incompletely evacuated from the floating gate electrodes as the Fowler-Nordheim tunneling current. Therefore, the short erasing operation allows the floating gate type field effect transistors to remain in the write-in state, and slightly approach the erased state.

After step S25, the control unit 11 shifts the control signal EVER1 indicative of the first criterion voltage level of 3.4 volts to the active high voltage level, and resets the address counter unit 4 for confirmation of the complete erased state as by step S26. With the control signal EVER1 of the active high voltage level, the variable voltage source 14 supplies the first criterion voltage level to the row address decoder unit 6, and the data comparator 15 checks the digit lines DL1 to DLn to see whether or not the memory cells coupled with the word line W1 turn on in the presence of the first criterion voltage level on the word line W1. If a floating gate type field effect transistor enters the complete erased state, the floating gate type field effect transistor turns on in the presence of the first criterion voltage level. However, if the floating gate type field effect transistor remains in the write-in state or the incomplete erased state, the floating gate type field effect transistor is turned off in the presence of the first criterion voltage level. For this reason, voltage levels on the digit lines DL1 reflect the state of the memory cells, and the data comparator 15 discriminates the states of the memory cells. If the data comparator 15 finds that the memory cell block still remains in the incomplete erased state, the control unit 11 increments the counter circuit assigned to the first error flag, and checks the counter circuit to see whether or not the first error flags are less than a first predetermined number M as by step S27. If the answer to step S27 is given affirmative, the control returns to step S25, and repeats the short erasing operation with the narrow erasing pulse. Thus, the control reiterates the loop consisting of steps S25 to S27 until the answer to step S26 is given affirmative or the answer to step S27 is given negative.

In so far as the product is excellent, the answer to step S26 is given affirmative before reaching M, and the control proceeds to step S28 to see whether or not the internal address signal is indicative of the final address. Since only the memory cell block assigned the first address entered the complete erased state, the answer to step S28 is given negative, and the control unit 11 increments the internal address signal Q0 to Q14 as by step S29. The control returns to step S26, and repeats the loop consisting of steps S25 to S29 so as to erase the memory cell block assigned the second address. Thus, the control reiterates the loop consisting of steps S25 to S29 until all of the memory cells enter the complete erased state.

When all of the memory cells enter the complete erased state, the answer to step S28 is given affirmative, and the confirmation of enhancement mode becomes executable. Namely, the control unit 11 shifts the control signal EVER2 indicative of the second criterion voltage level of 1.0 volt to the active high voltage level. The variable voltage source supplies the second criterion voltage level to the row address decoder unit 6, and the row address decoder unit 6 simultaneously applies the second criterion voltage level to the word lines W1 to Wm. The control unit 11 supplies the reset signal RS to the address counter 4, and the sets of digit lines DL1 to DLn are sequentially coupled with the sense unit 9. If any floating gate type field effect transistor has entered the excessively erased state, the excessively erased floating gate type field effect transistor is turned on in the presence of the second criterion voltage level, and the associated digit line is decayed. In this situation, the sense unit 9 reports the data bit of logic "1" level to the data comparator 15, and the data comparator 15 requests the control unit 11 to set the second error flag in the error flag counter 16. If any one of the memory cells entered the excessively erased state, the answer to step S30 is given negative, and the error flag counter is checked to see whether or not the number of the second error flags is less than a predetermined number N as by step S31. While the second error flags are less than N, the control returns to step S22, and reiterates the loop consisting of steps S22 to S31 until the answer to step S30 is given affirmative or the answer to step S31 is given negative. Thus, the write-in operation is carried out for all of the memory cells again so that the floating gate type field effect transistor is recovered from the excessively erased state.

Since the product is assumed to be excellent, the answer to step S30 is given affirmative before the second error flags are equal to the predetermined number N, and all of the memory cells are confirmed to have proper threshold levels. After the confirmation of the non-excessively erased state, a status signal indicative of completion of the automatic erasing operation is produced as by step S32, and a reset signal is shifted to inactive level as by step S33.

However, if the product is defective, any one of the memory cells does not enter the complete erased state or repeatedly enters the excessively erased state. In this situation, the first error flags are equal to the predetermined number M, or N second error flags are set in the error flag counter 16. For this reason, the answer to either step S27 or S31 is given negative, and the control unit 11 sets a flag indicative of defective memory cell array. In other words, the control unit 11 admits the defective memory cell array as by step S34, and proceeds to step S32.

As will be understood from the foregoing description, the memory cell array 2 is checked to see whether or not all of the floating gate type field effect transistors enter the complete erased state without excessively erased state, and the flash write electrically erasable and programmable read only memory device is free from the depletion mode memory cell.

Second Embodiment

Figure 10:
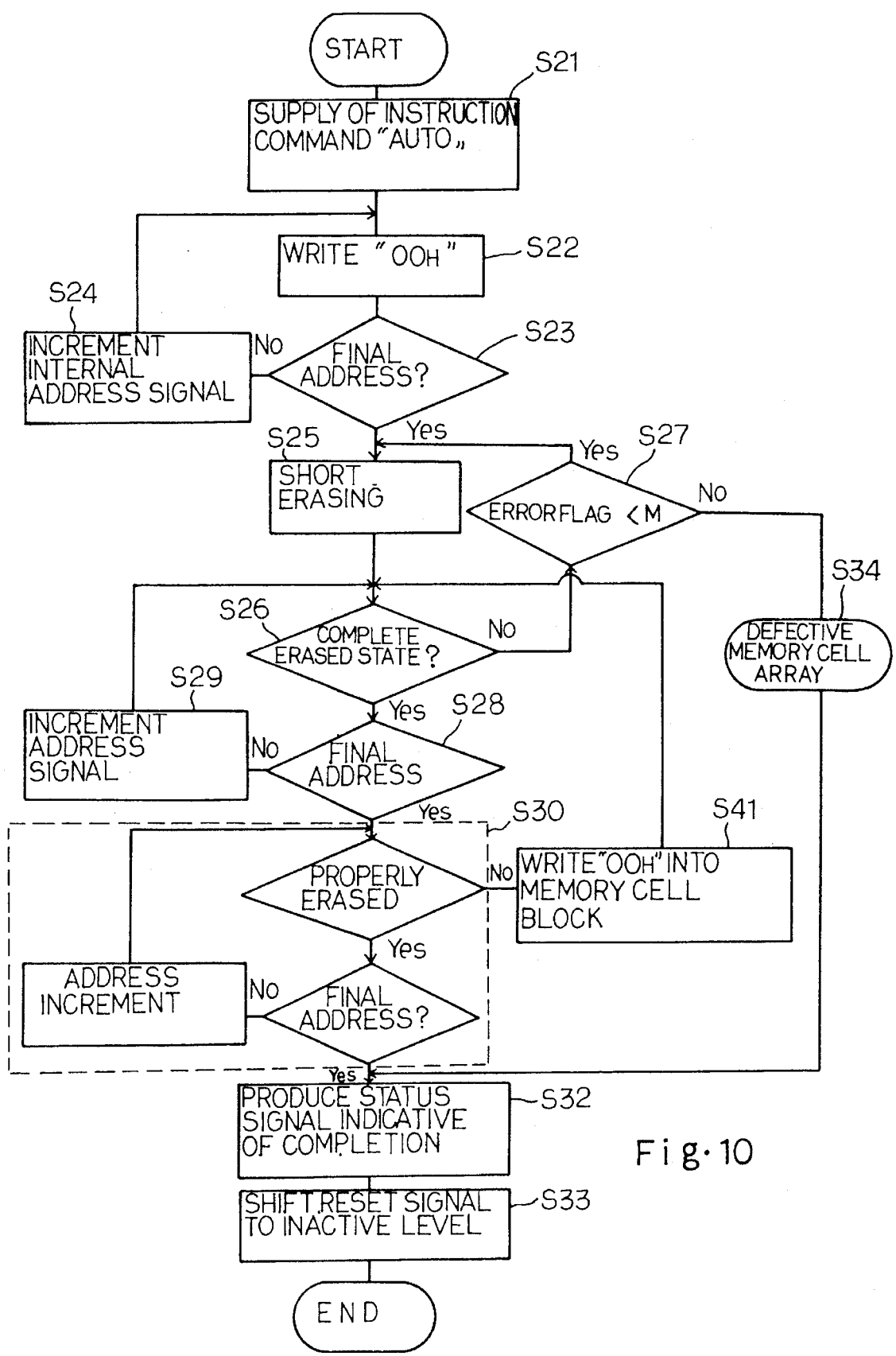
FIG. 10 is a flowchart showing the sequence of another automatic erasing mode of operation according to the present invention.

Turning to FIG. 10 of the drawings, another automatic erasing sequence according to the present invention is illustrated, and is executed by an electrically erasable and programmable read only memory device embodying the present invention. The automatic erasing sequence is similar to that of the first embodiment except for a write-in operation on an excessively erased state at step S41, and the other steps are labeled with the same references as those of the first embodiment.

In this instance, the address counter 4 sequentially increments the internal address signal, and every memory cell block is checked to see whether or not the excessively erased state takes place therein. If the data comparator 14 acknowledges an excessively erased memory cell, the data byte "$00_H$" is written into the memory cell block containing the excessively erased memory cell again as by step S41, and, thereafter, the control returns to step S26. As a result, the automatic erasing sequence of the second embodiment is completed within a relatively short time period.

Although particular embodiments of the present invention have been shown and described, it will be obvious to those skilled in the art that various changes and modifications may be made without departing from the spirit and scope of the present invention. For example, the electrically erasable and programmable read only memory device according to the present invention may form a part of an ultra large scale integration. Although the memory cell array 2 is three-dimensionally arranged, a memory cell array may be two-dimensionally arranged in another electrically erasable and programmable read only memory device according to the present invention. Moreover, the erasing operation may carry out on each memory cell group for storing a data byte.

What is claimed is:

1. An electrically erasable and programmable read only memory device having a write-in mode, a read-out mode and an erasing mode, comprising:

a memory cell array having a plurality of memory cell transistors having different threshold levels between an erased state and a write-in state, each of said plurality of memory cell transistors being connected to one of a plurality of word lines;

a write-in means for supplying a first voltage to one of said word lines in said write-in mode so as to cause the memory cell transistor corresponding to an address to enter into said write-in state;

a read-out means for supplying a second voltage to one of said word lines in said read-out mode so as to determine whether the memory cell transistor corresponding to the address is in one of said erased state and said write-in state;

an erasing means for performing an erasing operation on said plurality of memory cell transistors for a time period shorter than that which allows said plurality of memory cell transistors to be changed from said write-in state to said erased state;

an erased state checking means for successively supplying a third voltage lower than said second voltage to each of said plurality of word lines according to said address so as to check whether or not each of said plurality of memory cell transistors has entered into said erased state;

an excessively erased state checking means for successively supplying a fourth voltage lower than a threshold voltage of said erased state to each of said plurality of word lines according to said address so as to check whether or not there is a memory cell transistor in an excessively erased state among said plurality of memory cell transistors; and a control means for selectively activating said write-in means, said erasing means, said erased state checking means and said excessively erased state checking means in said erasing mode, said control means starting a write-in and erasing cycle wherein said write-in means causes said plurality of memory cell transistors to enter into said write-in state and, thereafter, said erasing means performs said erasing operation on said plurality of memory cell transistors and repeats said erasing operation until said erased state checking means confirms that said plurality of memory cell transistors has entered into said erased state, said control means repeating said write-in and erasing cycle when said excessively erased state checking means detects that said memory cell transistor is in said excessively erased state, said control means terminating said erasing mode when none of said memory cell transistors is in said excessively erased state.

2. The electrically erasable and programmable read only memory device as set forth in claim 1, further comprising a defect detecting means for counting the number of said write-in and erasing cycles repeated by said control means and producing a signal indicative of an improperly erased state when said number reaches a predetermined number.

3. The electrically erasable and programmable read only memory device as set forth in claim 1, further comprising an address counter controlled by said control means in said erasing mode, an output of said address counter being indicative of said address in said erasing mode.

4. The electrically erasable and programmable read only memory device as set forth in claim 1, further comprising a voltage generating circuit for generating said third voltage and said fourth voltage in said erasing mode.

5. A method of operating an electrically erasable and programmable read only memory device having a write-in mode, a read-out mode and an erasing mode, comprising the steps of:

providing a memory cell array having a plurality of memory cell transistors having different threshold levels between an erased state and a write-in state, each of said plurality of memory cell transistors being connected to one of a plurality of word lines;

providing a write-in means, a read-out means, an erasing means, an erased state checking means, an excessively erased state checking means and a control means;

supplying a first voltage from said write-in means to one said word lines in said write-in mode so as to cause the memory cell transistor corresponding to an address to enter into said write-in state;

supplying a second voltage from said read-out means to one of said word lines in said read-out mode so as to determine whether the memory cell transistor corresponding to the address is in one of said erased state and said write-in state;

carrying out an erasing operation by said erasing means on said plurality of memory cell transistors for a time period shorter than that which allows said plurality of memory cell transistors to be changed from said write-in state to said erased state;

successively supplying a third voltage lower than said second voltage from said erased state checking means to each of said plurality of word lines according to said address so as to check whether or not each of said plurality of memory cell transistors has entered into said erased state;

successively supplying a fourth voltage lower than a threshold voltage of said erased state from said excessively erased state checking means to each of said plurality of word lines according to said address so as to check whether or not there is a memory cell transistor in an excessively erased state among said plurality of memory cell transistors;

operating said control means to selectively activate said write-in means, said erasing means, said erased state checking means and said excessively erased state checking means in said erasing mode, so that said control means starts a write-in and erasing cycle wherein said write-in means causes said plurality of memory cell transistors to enter into said write-in state and, thereafter, carrying out said erasing operation by said erasing means on said plurality of memory cell transistors and repeating said erasing operation until said erased state checking means confirms that said plurality of memory cell transistors has entered into said erased state, and repeating said write-in and erasing cycle by said control means when said excessively erased state checking means detects that said memory cell transistor is in said excessively erased state, and terminating said erasing mode by said control means when none of said memory cell transistors is in said excessively erased state.

6. The method of operating an electrically erasable and programmable read only memory device as set forth in claim 5, further including the steps of:

counting the number of said write-in and erasing cycles repeated by said control means; and producing a signal indicative of an improperly erased state when said number reaches a predetermined number.

7. The method of operating an electrically erasable and programmable read only memory device as set forth in claim 5, further comprising the step of providing an address counter controlled by said control means in said erasing mode for supplying an output which is indicative of said address in said erasing mode.

8. The method of operating an electrically erasable and programmable read only memory device as set forth in claim 5, further comprising the step of providing a voltage generating circuit for generating said third voltage and said fourth voltage in said erasing mode.

* * * * *